(12) United States Patent
Takaya et al.

(10) Patent No.: US 6,749,928 B2
(45) Date of Patent: Jun. 15, 2004

(54) ELECTRONIC PARTS AND METHOD PRODUCING THE SAME

(75) Inventors: Minoru Takaya, Tokyo (JP); Toshikazu Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/079,907

(22) Filed: Feb. 22, 2002

(65) Prior Publication Data

US 2002/0122934 A1 Sep. 5, 2002

(30) Foreign Application Priority Data

Feb. 22, 2001 (JP) ........................................ 2001-047376
Feb. 8, 2002 (JP) ........................................ 2002-033075

(51) Int. Cl.[7] ............................ B32B 15/00; H05K 1/03
(52) U.S. Cl. ..................... 428/209; 428/213; 428/216; 428/323; 428/328; 428/329; 428/330; 428/331; 428/413; 428/416; 428/418; 428/446; 428/448; 428/450; 428/469; 428/458; 428/473.5; 428/480; 428/461; 428/689; 428/697; 428/698; 428/702; 428/704; 174/255; 174/258; 174/259
(58) Field of Search ................................. 428/209, 213, 428/323, 328, 329, 330, 331, 413, 416, 418, 446, 448, 450, 469, 458, 473.5, 480, 689, 697, 698, 702, 704, 216, 461, 334; 174/255, 258–259

(56) References Cited

U.S. PATENT DOCUMENTS 5,652,561 A 7/1997 Inoh et al.
6,073,339 A 6/2000 Levin

FOREIGN PATENT DOCUMENTS

| EP | 0 918 340 | 5/1999 | | |
|----|-----------|--------|---|---|
| GB | 781470 | 8/1957 | | |
| JP | 03-147205 | 6/1991 | | |
| JP | 4-36366 | * 2/1992 | .......... | C09J/109/02 |
| JP | 04-084489 | 3/1992 | | |
| JP | 05-048271 | 2/1993 | | |
| JP | 5-95197 | * 4/1993 | ............ | H05K/9/00 |
| JP | 6-77649 | 3/1994 | | |
| JP | 6-112648 | 4/1994 | | |
| JP | 07-022251 | 1/1995 | | |
| JP | 8-69712 | 3/1996 | | |
| JP | 08-216313 | 8/1996 | | |
| JP | 11-67578 | 3/1999 | | |
| JP | 11-192620 | 7/1999 | | |
| JP | 2000-340955 | 12/2000 | | |

OTHER PUBLICATIONS

Translations of JP–5–95197 to Nakayama et al.*
Translations of JP–8–69712 to Hara et al.*

* cited by examiner

Primary Examiner—Deborah Jones
Assistant Examiner—Ling Xu
(74) Attorney, Agent, or Firm—Oblon, Spivak, McClelland, Maier & Neustadt, P.C.

(57) ABSTRACT

The invention is to offer electronic parts and a method of producing the same in which a producing time is shortened, crack or warp are hard to occur, and cost-down can be attained. Core substrates are made by forming a resin or a compound material made by mixing powder-like functional materials with this resin into thin plates, and hardening them. Conductor patterns are formed on at least any of front and back surfaces of the core substrates through any of an evaporation process, an ion plating process, an ion beam process, a sputtering process, and a vapor deposition process, followed by patterning. Half-hardened prepregs are produced by forming the resin or the compound material made by mixing powder-like functional materials with this resin into the thin plates. The prepregs and the core substrates are alternately laminated and laminated layers are made by unifying through a hot pressing.

10 Claims, 5 Drawing Sheets

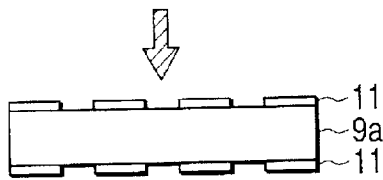
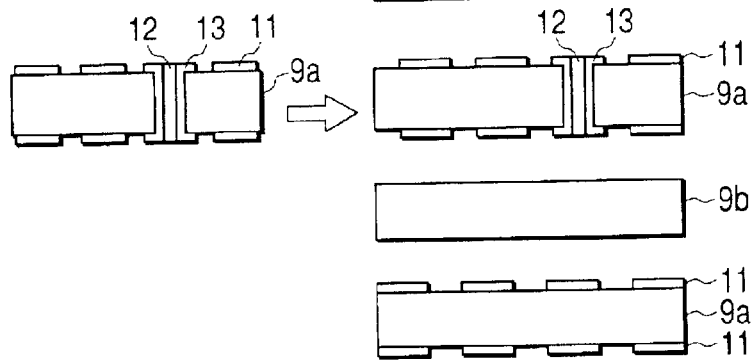
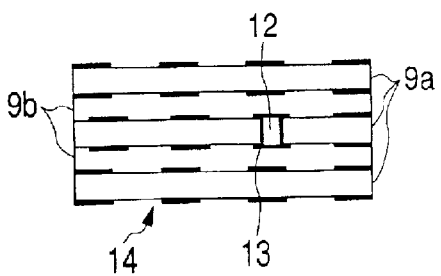
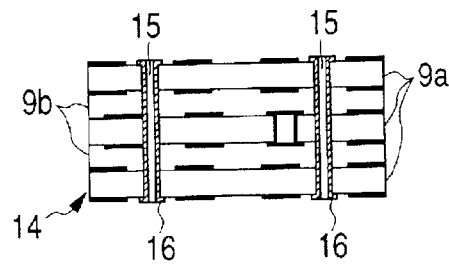
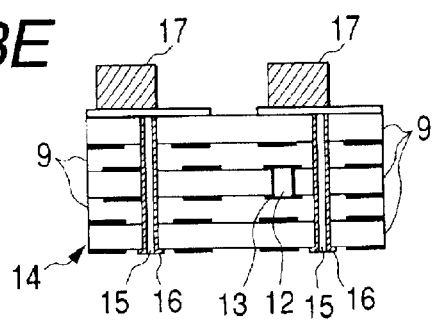

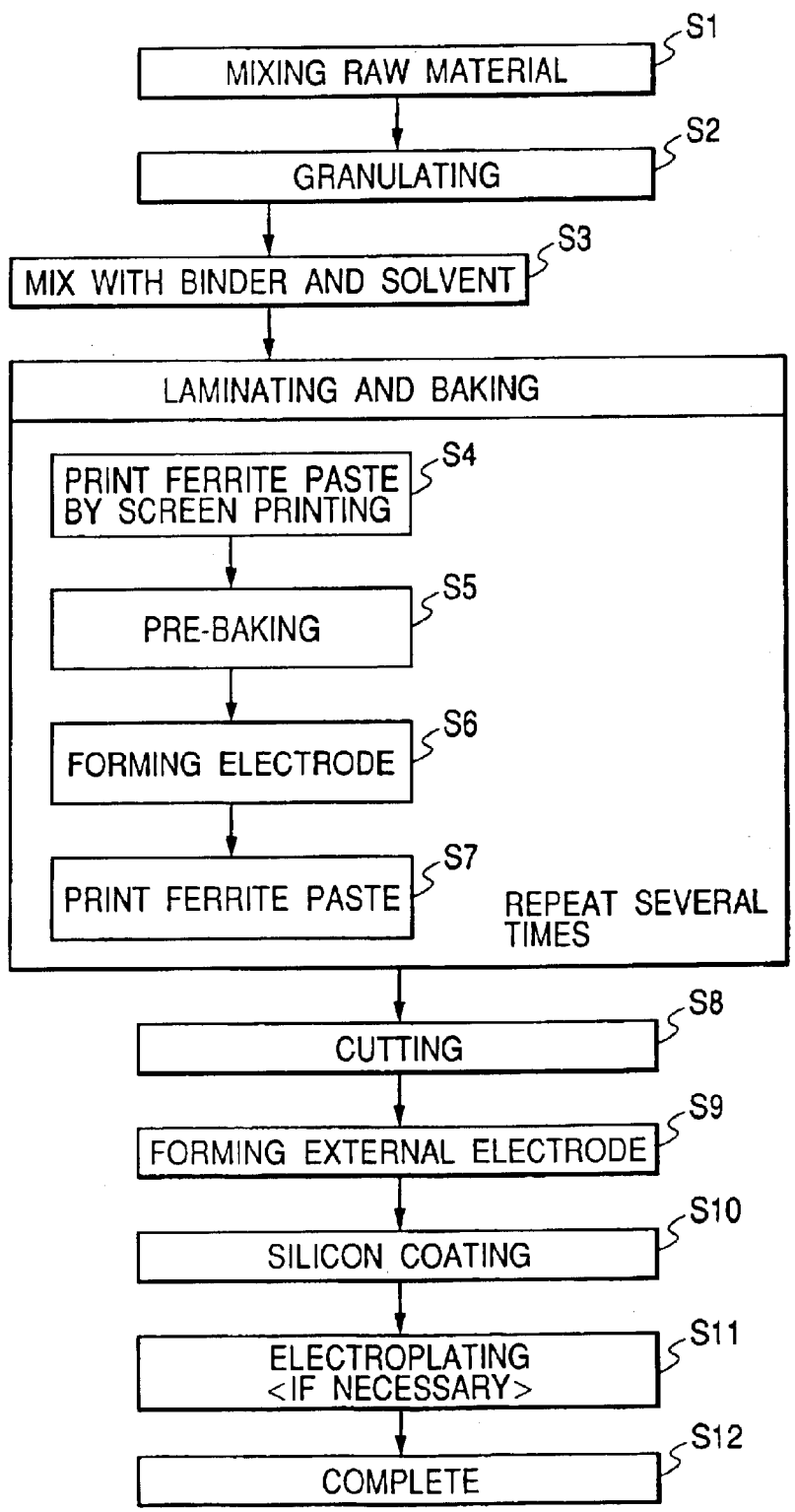

ELECTRONIC PARTS AND METHOD PRODUCING THE SAME

BACKGROUND OF THE INVENTION

The present invention relates to electronic parts formed in a multilayer structure by use of a resin or a compound material made by mixing powder functional material into this resin, and to a method of producing the same.

As a method of producing multilayer electronic parts by use of thin film conductors, JP-A-5-267063 discloses a method in FIG. 5 of the drawings attached herewith. As shown in the same, for instance, in case of producing an inductor, powders of raw material are mixed for providing desired functions as ferrite (Step S1), and granulating and pulverizing are carried out (Step S2). Then, the substances mixed and regulated in predetermined grain diameter are turned out to be enamels by use of binder and solvent (Step S3).

Laminating and baking steps carry out a screen printing (Step S4) of the ferrite paste, a pre-baking (Step S5) by rising temperature in a drying furnace, installation of inductor electrodes (Step S6) by forming the film through any of an evaporation, a spattering and an ion plating, and a screen printing (Step S7) of the ferrite paste. These steps are repeated several times until obtaining patterns of desired number. The forming of the electrode patterns is carried out simultaneously for many pieces of inductors.

Thereafter, products are cut per each of chips-(Step S8), and the chips are formed on sides with external electrodes by coating, evaporation or spattering (Step S9). Subsequently, other areas than the external electrodes are subjected to a silicone impregnation so that pores in the chip surface are impregnated with a synthetic (silicone) resin (Step S10). IF necessary, the external electrodes are subjected to an electroplating (Step S11).

For producing the multiplayer electronic parts using a resin or a compound material made by mixing functional materials (dielectric powder or magnetic powder) with this resin and thin film conductor formed by the evaporation or the like, the multilayer electronic parts are produced by repeating the printing of the compound material paste, the thermosetting and the forming of the thin film conductor.

In case of producing the electronic parts by the procedure of repeating the printing and the hardening as seen in the conventional examples, there have been problems that production cost is high, and a period till production is very long.

In addition, in the case of ceramics, for printing or forming the thin film conductor after baking, influences of fragility of a prime body are easy to appear, or as stress is loaded thereon, problems about cracks or warp easily occur. Laminated layers are baked for hours by nature, and when the number of layer increases, a long production time and cost are consumed.

Also in the case of the resin or the compound material, since the thermosetting and the printing are repeated to cause large stress loading thereon, the printed faces are roughened and when the number of layer increases, it becomes difficult to produce.

SUMMARY OF THE INVENITON

In view of the above mentioned problems, it is an object of the invention to provide electronic parts and a method of producing the same in which the producing time is shortened, and crack or warp are hard to occur, reduction of cost can be attained, and the production can be performed even if the number of layer is many.

A method of producing electronic parts of a first aspect of the invention is characterized by comprising: forming a resin or a compound material made by mixing powder-like functional materials with this resin into thin plate, hardening it to be core substrates; forming thin film conductor on at least any of front and back surfaces of the core substrate through any of an evaporation process, an ion plating process, an ion beam process, a vapor deposition process, and a sputtering process, followed by patterning; forming the resin or the compound material made by mixing powder-like functional materials with this resin into the prepregs like thin plates, alternately laminating half-hardened prepregs and the core substrates, and subsequently hot-pressing and unifying into multilayer parts.

As seeing, if the core substrate and the prepreg are separately produced, and lamination and hardening are carried out concurrently, the production time can be shortened and the cost is lowered. Since the whole is once hardened by hot-pressing, crack or warp are hard to occur, and the production is possible even though the number of layer is many.

Further, the thin film conductor can be made thin, so that it is possible to firstly make parts thin (in particular, this effect is remarkably in a capacitor), secondly heighten patterning precision and accuracy in layer-to-layer, and thirdly avoid migration because the thin film conductor is thin so that the resin is buried around its periphery. In this application, the term "powder-like" includes grain form, flake form, needle form, spike form, or the like.

An electronic part of a second aspect of the invention is characterized by comprising: a core substrate made by forming the resin or the compound material made by mixing the powder functional materials with this resin into thin plates, and hardening it; a thin film conductor formed on at least any of front and back surfaces of the core substrate through the film forming technique and carried out with the patterning; and an adhesive layer formed with the resin or the compound material made by mixing the powder-like functional material with this resin, and interposed among core substrates formed with the thin film conductors; wherein laminated layers made of the core substrates and the prepregs for the adhesive layers are unified by hot-pressing.

If the electronic parts are composed of such a laminated structure, as mentioned in the first aspect, the production time can be shortened, the cost is lowered and crack or warp are avoided from occurrence.

The electronic part of a third aspect of the invention is, in the second aspect, that the thin film conductor has thickness less than 5 $\mu$m.

When the thickness is more than 5 $\mu$m, time is taken too much for forming the thin film, and it is difficult to shorten the production time. Because the thickness restricted less than 5 $\mu$m, it is possible to avoid the manufacturing time from becoming long. In case of the thickness is less than 1 $\mu$m, a conductor resistance becomes large. Therefore, in order to maintain a Q value at a predetermined level, thickness of the thin film conductor preferably has more than 1 $\mu$m. However, in case of capacitor or noise removing circuit which allows large loss, thickness of the thin film conductor may be less than 1 $\mu$m, but more than 0.3 $\mu$m.

Moreover, according to the electronic part of the present invention, as a resin, at least one thermosetting resin selected from a group consisting of epoxy resin, phenol resin, unsaturated polyester resin, vinyl ester resin, polyimide resin, bismaleimidotriazine (cyanate ester) resin, polyphenylene ether (oxide) resin, fumarate resin, polybutadiene resin, and vinylbenzyl resin, or at least one thermoplastic resin selected from a group consisting of aromatic polyester resin, polyphenylene sulfide resin, polyethylene terephtalate resin, polybutylene terephtalate resin, polyethylene sulfide resin, polyethl ether ketone resin, polytetrafluoroethylene resin, polyarylate resin and graft resin, or a composite resin composed of at least one of the thermosetting resin and at least one of the thermoplastic resin may be used.

Moreover, according to the electronic part of the present invention, as the powder-like functional material, at least one ferrite magnetic material selected from a group consisting of Mn—Mg—Zn based magnetic material, Ni—Zn based magnetic material, and Mn—Zn based magnetic material, or at least one ferromagnetic metallic magnetic material selected from a group consisting of carbonyl iron, iron-silicon based alloy, iron-aluminum-silicon based alloy, iron-nickel based alloy, and amorphous (iron based or cobalt based) alloy, or at least one dielectric material selected from a group consisting of $BaO—TiO_2—Nd_2O_3$ based dielectric material, $BaO—TiO_2—SnO_2$ based dielectric material, $PbO—CaO$ based dielectric material, $TiO_2$ based dielectric material, $BaTiO_3$ based dielectric material, $PbTiO_3$ based dielectric material, $SrTiO_3$ based dielectric material, $CaTiO_3$ dielectric material, $Al_2O_3$ based dielectric material, $BiTiO_4$ based dielectric material, $MgTiO_3$ based dielectric material, $(Ba, Sr)TiO_3$ based dielectric material, $Ba(Ti, Zr)O_3$ based dielectric material, $BaTiO_3—SiO_2$ based dielectric material, $BaO—SiO_2$ based dielectric material, $CaWO_4$ based dielectric material, $Ba (Mg, Nb)O_3$ based dielectric material, $Ba (Mg, Ta)O_3$ based dielectric material, $Ba(Co, Mg, Nb)O_3$ based dielectric material, $Ba(Co, Mg, Ta)O_3$ based dielectric material, $Mg_2SiO_4$ based dielectric material, $ZnTiO_3$ based dielectric material, $SrZrO_3$ based dielectric material, $ZrTiO_4$ based dielectric material, $(Zr, Sn)TiO_4$ based dielectric material, $BaO—TiO_2—Sm_2O_3$ based dielectric material, $PbO—BaO—Nd_2O_3—TiO_2$ based dielectric material, $(Bi_2O_3, PbO)—BaO—TiO_2$ based dielectric material, $La_2Ti_2O_7$ based dielectric material, $Nd_2Ti_2O_7$ based dielectric material, $(Li, Sm)TiO_3$ based dielectric material, $Ba(Zn, Ta)O_3$ based dielectric material, $Ba(Zn, Nb)O_3$ based dielectric material and $Sr(Zn, Nb)O_3$ based dielectric material, or composite functional material composed of at least two of the above mentioned ferrite magnetic materials, ferromagnetic metallic magnetic materials, and dielectric materials may be used.

BRIEF DESCRIPTION OF THE DRAWINGS

FIGS. 3A to 3E are explanatory views of procedures of remaining parts practicing the production method of the electronic part according to the invention;

FIG. 5 is a procedure showing the conventional production method of the electronic part.

DETAILED DESCRIPTION OF THE PREFERRED EMBODIMENTS

Figure 1:
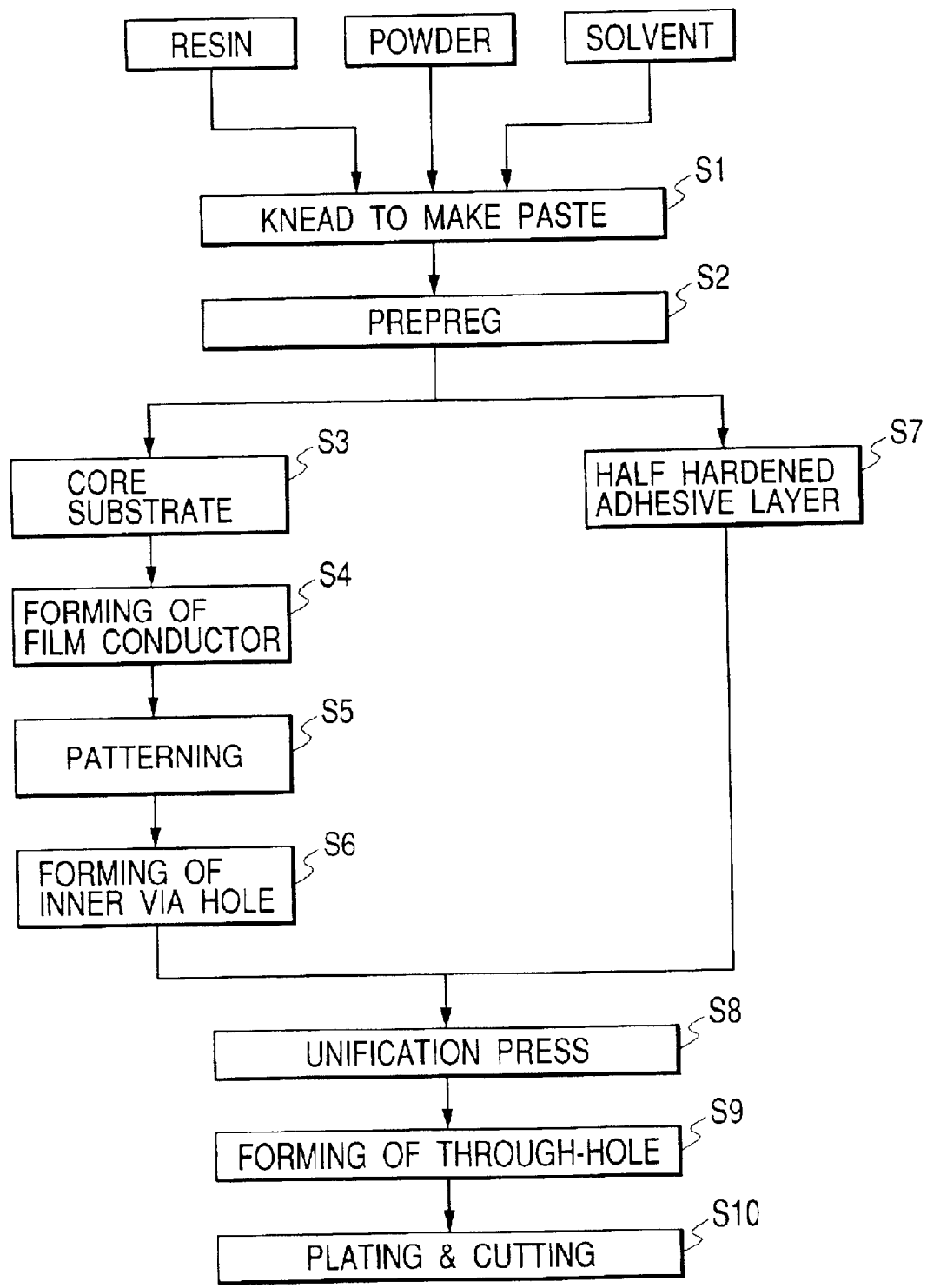
FIG. 1 is a processing diagram showing one embodiment of the production method of the electronic parts according to the invention.

FIG. 1 is a processing diagram showing one embodiment of the production method of the electronic parts according to the invention, and FIGS. 2 and 3 are explaining views illustrating respective steps.

In the Step S1 of FIG. 1, for producing the compound material, the resin is added with the powder-like functional material (magnetic material powder or dielectric material powder) and a solvent such as toluene, and kneaded to make a paste. Herein, as the resins, at least one thermosetting resin selected from a group consisting of epoxy resin, phenol resin, unsaturated polyester resin, vinyl ester resin, polyimide resin, bismaleimidotriazine (cyanate ester) resin, polyphenylene ether (oxide) resin, fumarate resin, polybutadiene resin, and vinylbenzen vinilbenzyl resin, or at least one thermoplastic resin selected from a group consisting of aromatic polyester resin, polyphenylene sulfide resin, polyethylene terephtalate resin, polybutylene terephtalate resin, polyethylene sulfide resin, polyethyl ether ketone resin, polytetrafluorethylene polytetrafluoroethylene resin, polyarylate resin and graft resin, or a composite resin composed of at least one of the thermosetting resin and at least one of the thermoplastic resin may be used.

The powder-like functional material to be mixed with these resin is at least one ferrite magnetic material selected from a group consisting of Mn—Mg—Zn based magnetic material, Ni—Zn based magnetic material, and Mn—Zn based magnetic material, or at least one ferromagnetic metallic magnetic material selected from a group consisting of carbonyl iron, iron-silicon based alloy, iron-aluminum-silicon based alloy, iron-nickel based alloy, and amorphous (iron based or cobalt based) alloy, or at least one dielectric material selected from a group consisting of $BaO—TiO_2—Nd_2O_3$ based dielectric material, $BaO—TiO_2—SnO_2$ based dielectric material, $PbO—CaO$ based dielectric material, $TiO_2$ based dielectric material $BaTiO_3$ based dielectric material, $PbTiO_3$ based dielectric material, $SrTiO_3$ based dielectric material, $CaTiO_3$ based dielectric material, $Al_2O_3$ based dielectric material, $BiTiO_4$ based dielectric material, $MgTiO_3$ based dielectric material, $(Ba, Sr)TiO_3$ based dielectric material, $Ba(Ti, Zr)O_3$ based dielectric material, $BaTiO_3—SiO_2$ based dielectric material, $BaO—SiO_2$ based dielectric material, $CaWO_4$ based dielectric material, $Ba(Mg, Nb)O_3$ based dielectric material, $Ba(Mg, Ta)O_3$ based dielectric material, $Ba(Co, Mg, Nb)O_3$ based dielectric material, $Ba(Co, Mg, Ta)O_3$ based dielectric material, $Mg_2SiO_4$ based dielectric material, $ZnTiO_3$ based dielectric material, $SrZrO_3$ based dielectric material, $ZrTiO_4$ based dielectric material, $(Zr, Sn) TiO_4$ based dielectric material, $BaO—TiO_2—SM_2O_3$ based dielectric material, $PbO—BaO—Nd_2O_3—TiO_2$ based dielectric material, $(Bi_2O_3, PbO)—BaO—TiO_2$ based dielectric material, $La_2Ti_2O_7$ based dielectric material, $Nd_2Ti_2O_7$ based dielectric material, $(Li, Sm)TiO_3$ based dielectric material, $Ba (Zn, Ta)O_3$ based dielectric material, $Ba(Zn, Nb)O_3$ based dielectric material and $Sr(Zn, Nb)O_3$ based dielectric material, or composite functional material composed of at least two of the above mentioned ferrite magnetic materials, ferromagnetic metallic magnetic materials, and dielectric materials may be used.

For reducing the invention to practice, other resin, magnetic powder and dielectric powder may be of course served.

Figure 2A:
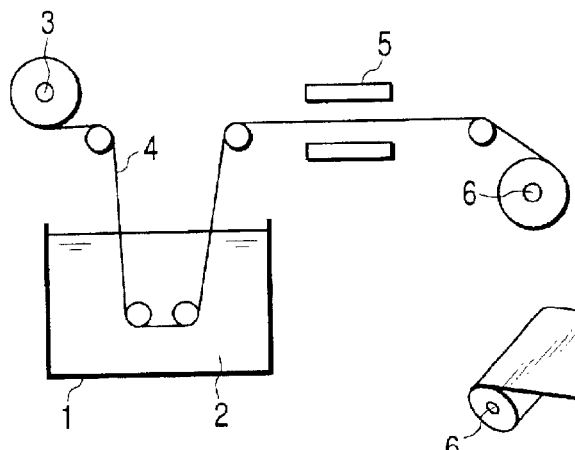
FIGS. 2A to 2F are explanatory views of procedures of one part practicing the production method of the electronic part according to the invention.
Figure 2B:
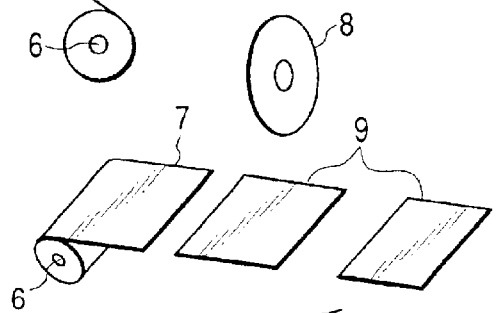
Figure 2C:
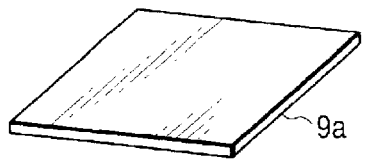

In the Step S2 of FIG. 1, the prepreg is made as shown in FIG. 2A. That is, a glass cloth wound on a reel 3 is drawn out into a container 1 supporting the paste 2 of the compound material, and is immersed in the paste 2. Subsequently, the paste coated on the glass cloth 4 is dried by passing the glass cloth 4 through a dryer 5, and a blank material 7 is wound on a reel 6. Then, this blank material 7 is cut by a cutter 8 into desired sizes as shown in FIG. 2B, and glass-cloth-contained prepregs 9 are produced.

Figure 2F:

The thus produced prepregs are divided into left-side Steps S3 to S6 of FIG. 1 and a right-side Step S7, and utilized as the core substrate 9a (see FIG. 2C) or as the prepreg 9b as a half hardened adhesive layer (see FIG. 2F). For forming the core substrate (Step S3), in case, e.g., the vinyl benzyl resin is used to the compound material paste, it is carried out at 200° C. for 2 hours.

As to the half-hardening of the prepreg 9b of Step S7, in case of using, for example, vinyl benzyl resin in the compound material 2, it is practiced at 110° C. for 1 hour.

Figures 2D, 2E:
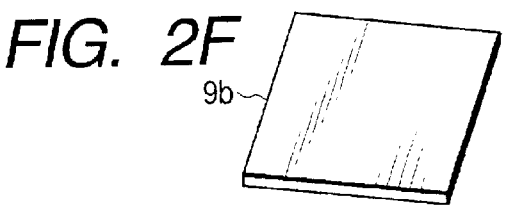

In the thin film conductor forming process in Step S4, as shown in FIG. 2D, the thin film conductor 10 is formed on the front and back surfaces of the core substrate 9a through the thin film forming technique such as the evaporation process, the ion plating process, the ion beam process, the sputtering process, and the vapor deposition process. In this case, as the thin film conductor 10, copper, silver, nickel, tin, zinc, or aluminum may be used.

In the patterning process of Step S5, a resist film is formed on the core substrate 9a, and passing through exposure for forming patterns of conductor layer thereafter, partial removal of the resist film, thin film conductor etching on the removed areas, and resist film removing process, the patterned thin film conductors 11 are, formed in FIG. 2E. The thin film conductors 11 are many on one sheet of core substrate 9a, and a plurality of the same patterns are arranged longitudinally and laterally. There is also the method of forming a thin film conductor pattern through a mask as methods other than the above patterning process.

In an inner via forming process of Step S6, as shown in FIG. 3A, via holes 12 are formed by drilling, punching or laser applying, and the inner wall thereof is plated with the conductor 13, and the patterns 11, 11 on the both surfaces of the core substrate 9a are connected each other. Thus, when plating conductor 13 in the inner wall of a via hole 12, proper masking, such as a resist film coating, is performed to thin film conductor 11 so as to not thicken the thickness of the conductor 11.

In a unification press of Step S8, as shown in FIG. 3B, the core substrate 9a and the prepreg 9b as the adhesive layer are alternately laminated, and subjected to hot-pressing at substantially hardening temperatures and for time therefor, whereby the layer of the prepreg 9b is also substantially hardened. Thus, the unified and laminated layers 14 are produced as shown in FIG. 3c.

In forming through-holes of Step S9, as shown in FIG. 3D, the through-holes 15 are formed by the drilling, punching or laser applying and the inner walls thereof are plated with the conductor 16, and the pattern 11-to-the pattern 11 on the both surfaces of the core substrate 9a or these inner patterns-to-the patterns 11, otherwise the inner pattern 11-to-the inner pattern 11 are connected each other.

In the plating process and cutting process in Step S10, the required plating as solder-plating is performed, followed by cutting into chips in pieces. As shown in FIG. 3E, when mounting parts 17, these parts 17 are soldered before or after cutting into pieces of chips.

The core substrate 9a and the prepreg 9b are separately made and laminated, and hardening are concurrently carried out, whereby the production time is shortened and the reduction of cost can be attained. In addition, as the whole is once hardened by the hot pressing, crack or warp are hard to occur. If the pattern 11 is formed by use of copper foil as conventionally, it is generally used a foil having thickness around 18 μm. On the other hand, when the pattern is formed with the thin film conductor 11 as the invention, a thin film of lower than 9 μm can be easily produced. Therefore, the laminated layers are less rugged by the thickness of the conductor 11, and properties when forming capacitors or inductors are little in dispersion.

The thickness of the thin film conductor 10 is preferably less than 5 μm. When the thickness of the thin film conductor 10 is more than 5 μm, time is taken too much for forming the thin film, and it is difficult to shorten the production time. Because the thickness restricted less than 5 μm, it is possible to avoid the manufacturing time from becoming long. In case of the thickness is less than 1 μm, a conductor resistance becomes large. Therefore, in order to maintain a Q value at a predetermined level, thickness of the thin film conductor preferably has more than 1 μm. However, in case of capacitor or noise removing circuit which allows large loss, thickness of the thin film conductor may be less than 1 μm, but more than 0.3 μm.

Figure 4A:
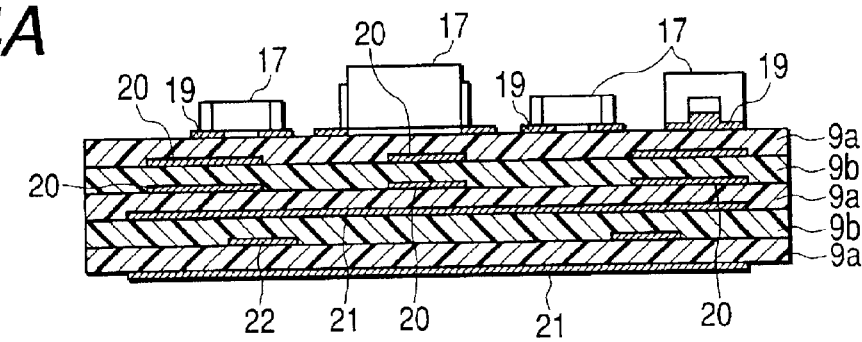
FIG. 4A is a cross sectional view showing one example of the electronic part according to the invention.
Figure 4B:
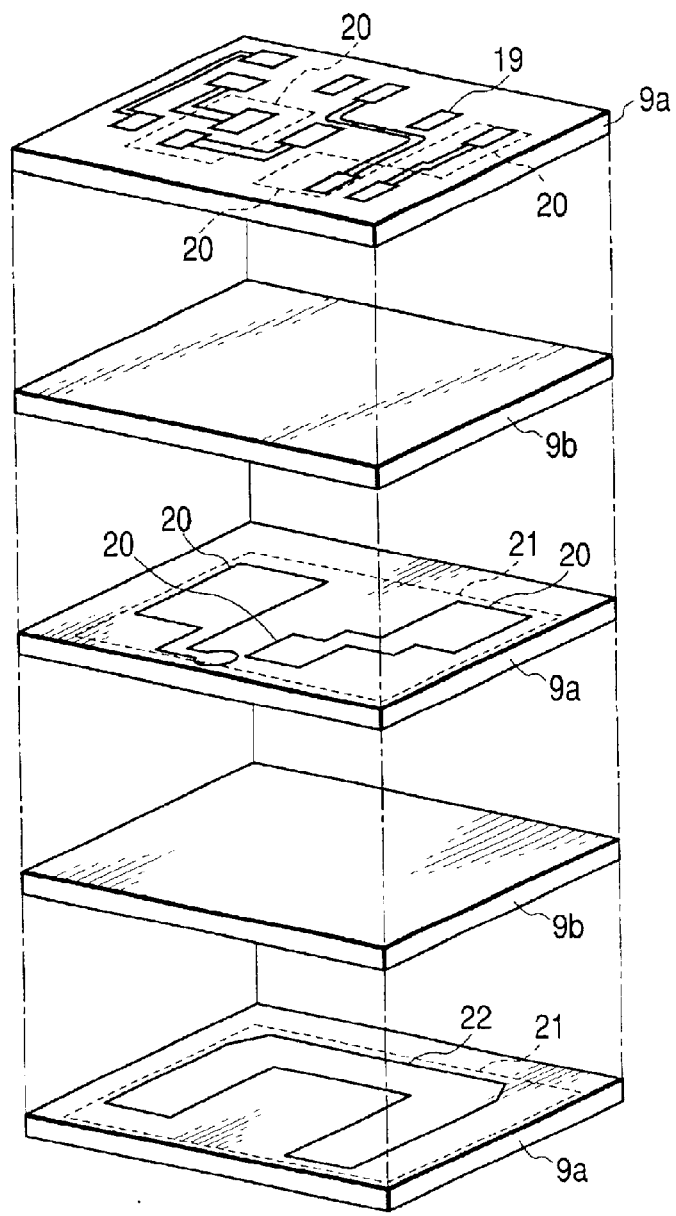
FIG. 4B is a view of layer-structure.

FIG. 4A is a cross sectional view showing one example of the electronic part according to the invention, and FIG. 4B is a view of layer-structure. This example is a voltage controlled oscillator (VCO), and 9a is the core substrate, 9b is the prepreg or a prepreg hardened and adhered to the core substrate 9a. Reference numeral 19 is a surface land pattern, 20 is capacitor electrodes, 21 is ground electrodes holding strip lines 22 composing a resonator therebetween. Reference numeral 17 is parts of semi-conductor such as transistors or variable capacitance diode, or mounted parts comprising capacitor of large capacitance, inductor chip, or chip resistor.

The invention can be realized, other than the above mentioned examples, as a capacitor, inductor, LC filter, LCR filter or various kinds of modules in which semiconductor devices and passive parts (circuit) are combined, that is, hybrid integrated. For reducing the invention to practice, it is possible to realize such a structure of forming the thin film conductor 11 only one side of the front and back surfaces of the core substrate 9a at a part or whole of the electronic part.

According to the present invention, in comparison with the conventional art in that copper foil is used, the thin film conductor of the present invention realizes to make electronic parts thin. Specifically, when the conventional electronic part include eight layers of 18 μm copper foil which is generally used as conductor pattern and seven resin layers as insulation layer each having 60 μm thickness, the thickness of the electronic part is 564 μm (60 μm×7+18 μm×8= 564 μm).

On the other hand, in the example of the invention, when the thin film conductor 11 has 3 μm thickness, and the other conditions (thickness of the resin layer and numbers of resin layers and conductor layers) are the same, the thickness of the electronic part of the present invention is 444 μm (60 μm×7+3 μm×8=444 μm). Thus, according to the invention, the electronic part thinner 120 μm than the conventional can be obtained.

Further, according to the conventional art, minimum conductor pattern width is about 50 μm and minimum distance between patterns is also about 50 μm. On the other hand, according to the present invention, minimum conductor pattern width is about 10 μm and minimum distance between patterns is also about 10 μm. Thus, the conductor pattern can be fine and pattern accuracy also can be improved.

According to the invention, as the core substrate and the prepreg are separately formed, alternately laminated, and hardened at the same time to produce the electronic part, the production time is shortened and the cost-down can be attained. As the whole is once hardened by the hot pressing, crack or warp are hard to occur. By making the conductor thin, it is possible to make the patterns fine and parts thin, heighten patterning precision and accuracy in layer-to-layer, and avoid migration.

According to the invention, the thin film conductor is made less than 5 µm in thickness, so that the conductor thickness is not large, it is possible to avoid the time from becoming long.

What is claimed is:

1. An electronic part comprising:
   a plurality of core substrates including at least one core substrate having at least one thin film conductor having thickness less than 5 µm and formed on at least one of front and back surfaces of the at least one core substrate through a thin film forming technique and carried out with a patterning; and
   a plurality of adhesive layers alternately interposed between the plurality of core substrates,
   wherein the plurality of core substrates and plurality of adhesive layers comprise a plurality of prepregs comprising a compound material made by mixing powder-like functional material with a resin, and are unified by hot-pressing and form laminated layers.

2. The electronic part as claimed in claim 1, wherein said resin comprises at least one thermosetting resin selected from the group consisting of epoxy resin, phenol resin, unsaturated polyester resin, vinyl ester resin, polyimide resin, bismaleimidotriazine resin, cyanate ester resin, polyphenylene ether resin, polyphenylene oxide resin, fumarate resin, polybutadiene resin, and vinylbenzyl resin.

3. The electronic part as claimed in claim 1, wherein said resin comprises at least one thermoplastic resin selected from the group consisting of polyphenylene sulfide resin, polyethylene terephtalate resin, polybutylene terephtalate resin, polyethylene sulfide resin, polyethyl ether ketone resin, polytetrafluoroethylene resin, and polyarylate resin.

4. The electronic part as claimed in claim 1, wherein said resin comprises composite resin composed of at least one of the thermosetting resin and at least one of the thermoplastic resin,
   said thermosetting resin is selected from the group consisting of epoxy resin, phenol resin, unsaturated polyester resin, vinyl ester resin, polyimide resin, bismaleimidotriazine resin, cyanate ester resin, polyphenylene ether resin, polyphenylene oxide resin, fumarate resin, polybutadiene resin, and vinylbenzyl resin, and
   said thermoplastic resin is selected from the group consisting of polyphenylene sulfide resin, polyethylene terephthalate resin, polybutylene terephtalate resin, polyethylene sulfide resin, polyethyl ether ketone resin, polytetrafluoroethylene resin, and polyarylate resin.

5. The electronic part as claimed in claim 1, wherein said powder-like functional material comprises at least one ferrite magnetic material selected from the group consisting of Mn—Mg—Zn based magnetic material, Ni—Zn based magnetic material, and Mn—Zn based magnetic material.

6. The electronic part as claimed in claim 1, wherein said powder-like functional material comprises at least one ferromagnetic metallic magnetic material selected from the group consisting of carbonyl iron, iron-silicon based alloy, iron-aluminum-silicon based alloy, iron-nickel based alloy, amorphous iron based alloy and amorphous cobalt based alloy.

7. The electronic part as claimed in claim 1, wherein said powder-like functional material comprises at least one dielectric material selected from the group consisting of BaO—TiO$_2$—Nd$_2$O$_3$ based dielectric material, BaO—TiO$_2$—SnO$_2$ based dielectric material, PbO—CaO based dielectric material, TiO$_2$ based dielectric material, BaTiO$_3$ based dielectric material, PbTiO$_3$ based dielectric material, SrTiO$_3$ based dielectric material, CaTiO$_3$ based dielectric material, Al$_2$O$_3$ based dielectric material, BiTiO$_4$ based dielectric material, MgTiO$_3$ based dielectric material, BaTiO$_3$—SrTiO$_3$ based dielectric material, BaTiO$_3$—BaZrO$_3$ based dielectric material, BaTiO$_3$—SiO$_2$ based dielectric material, BaO—SiO$_2$ based dielectric material, CaWO$_4$ based dielectric material, BaMgO$_3$—BaNbO$_3$ based dielectric material, BaMgO$_3$—BaTaO$_3$ based dielectric material, BaCoO$_3$—BaMgO$_3$BaNbO$_3$—based dielectric material, BaCoO$_3$—BaMgO$_3$—BaTaO$_3$ based dielectric material, Mg$_2$SiO$_4$ based dielectric material, ZnTiO$_3$ based dielectric material, SrZrO$_3$ based dielectric material, ZrTiO$_4$ based dielectric material, ZrTiO$_4$—SnTiO$_4$ based dielectric material, BaO—TiO$_2$—Sm$_2$O$_3$ based dielectric material, PbO—BaO—Nd$_2$O$_3$—TiO$_2$ based dielectric material, Bi$_2$O$_3$PbO—BaO—TiO$_2$ based dielectric material, La$_2$Ti$_2$O$_7$ based dielectric material, Nd$_2$Ti$_2$O$_7$ based dielectric material, LiTiO$_3$—SmTiO$_3$ based dielectric material, BaZnO$_3$—BaTaO$_3$ based dielectric material, BaZnO$_3$—BaNbO$_3$based dielectric material and SrZnO$_3$—SrNbO$_3$ based dielectric material.

8. The electronic part as claimed in claim 1, wherein said powder-like functional material comprises composite functional material composed of at least two of ferrite magnetic materials, ferromagnetic metallic magnetic materials, and dielectric materials,
   said ferrite magnetic material is selected from a group consisting of Mn—Mg—Zn based magnetic material, Ni—Zn based magnetic material, and Mn—Zn based magnetic material,
   ferromagnetic metallic magnetic material is selected from the group consisting of carbonyl iron, iron-silicon based alloy, iron-aluminum-silicon based alloy, iron-nickel based alloy, amorphous iron based alloy and amorphous cobalt based alloy, and dielectric material selected from the group consisting of BaO—TiO$_2$—Nd$_2$O$_3$ based dielectric material, BaO—TiO$_2$—SnO$_2$ based dielectric material, PbO—CaO based dielectric material, TiO$_2$ based dielectric material, BaTiO$_3$ based dielectric material, PbTiO$_3$ based dielectric material, SrTiO$_3$ based dielectric material, CaTiO$_3$ based dielectric material, Al$_2$O$_3$ based dielectric material, BiTiO$_4$ based dielectric material, MgTiO$_3$ based dielectric material, BaTiO$_3$—SrTiO$_3$ based dielectric material, BaTiO$_3$—BaZrO$_3$ based dielectric material, BaTiO$_3$SiO$_2$ based dielectric material, BaO—SiO$_2$ based dielectric material, CaWO$_4$ based dielectric material, BaMgO$_3$—BaNbO$_3$ based dielectric material, BaMgO$_3$—BaTaO$_3$ based dielectric material, BaCoO$_3$—BaMgO$_3$—BaNbO$_3$ based dielectric material, BaCoO$_3$—BaMgO$_3$—BaTaO$_3$ based dielectric material, Mg$_2$SiO$_4$ based dielectric material, ZnTiO$_3$ based dielectric material, SrZrO$_3$ based dielectric material, ZrTiO$_4$ based dielectric material, ZrTiO$_4$—SnTiO$_4$ based dielectric material, BaO—TiO$_2$—Sm$_2$O$_3$ based dielectric material, PbO—BaO—Nd$_2$O$_3$—TiO$_2$ based dielectric material, Bi$_2$O$_3$—PbO—BaO—TiO$_2$ based dielectric material, La$_2$Ti$_2$O$_7$ based dielectric material, Nd$_2$Ti$_2$O$_7$ based dielectric material, LiTiO$_3$—SmTiO$_3$ based dielectric material, BaZnO$_3$—BaTaO$_3$ based dielectric material, BaZnO$_3$—BaNbO$_3$ based dielectric material and SrZnO$_3$—SrNbO$_3$ based dielectric material.

9. The electronic part as claimed in claim 1, wherein said resin comprises aromatic polyester resin.

10. The electronic part as claimed in claim 1, wherein said resin comprises composite resin composed of at least one of the thermosetting resin and at least one of the thermoplastic resin, said thermosetting resin is selected from the group consisting of epoxy resin, phenol resin, unsaturated polyester resin, vinyl ester resin, polyimide resin, bismaleimidotriazine resin, cyanate ester resin, polyphenylene ether resin, polyphenylene oxide resin, fumarate resin, polybutadiene resin, and vinylbenzyl resin, and said thermoplastic resin comprises aromatic polyester resin.

* * * * *